(12) United States Patent
Ko et al.

(10) Patent No.: US 9,559,140 B2
(45) Date of Patent: Jan. 31, 2017

(54) IMAGE SENSOR AND METHOD OF FABRICATING THE SAME

(71) Applicant: Samsung Electronics Co., Ltd., Suwon-Si, Gyeonggi-Do (KR)

(72) Inventors: JeongWook Ko, Seoul (KR); Hongki Kim, Hwaseong-si (KR); Younghoon Park, Suwon-si (KR); Wonje Park, Yongin-si (KR); Yu Jin Ahn, Seongnam-si (KR); Junetaeg Lee, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 0 days.

(21) Appl. No.: 14/465,062

(22) Filed: Aug. 21, 2014

(65) Prior Publication Data

US 2015/0130005 A1 May 14, 2015

(30) Foreign Application Priority Data

Nov. 14, 2013 (KR) .................... 10-2013-0138429

(51) Int. Cl.
*H01L 27/146* (2006.01)
(52) U.S. Cl.
CPC ..... *H01L 27/14685* (2013.01); *H01L 27/1464* (2013.01); *H01L 27/14607* (2013.01); *H01L 27/14621* (2013.01); *H01L 27/14623* (2013.01); *H01L 27/14627* (2013.01); *H01L 27/14629* (2013.01); *H01L 27/14641* (2013.01); *H01L 27/14687* (2013.01)

(58) Field of Classification Search
CPC ............... H01L 27/14601; H01L 27/14607; H01L 27/14627; H01L 27/14621; H01L 27/14623; H01L 27/146–27/148
See application file for complete search history.

(56) References Cited

U.S. PATENT DOCUMENTS

| | | | |
|---|---|---|---|
| 6,376,872 B1 * | 4/2002 | Pai | H01L 27/14621 257/291 |
| 6,838,715 B1 | 1/2005 | Bencuya et al. | |
| 7,315,014 B2 | 1/2008 | Lee et al. | |
| 7,688,377 B2 | 3/2010 | Matsuda et al. | |
| 7,728,271 B2 | 6/2010 | Silsby et al. | |
| 8,084,798 B2 | 12/2011 | Koike | |

(Continued)

FOREIGN PATENT DOCUMENTS

| | | |
|---|---|---|
| JP | 2001-196571 A | 7/2001 |
| JP | 2004-356585 A | 12/2004 |

(Continued)

*Primary Examiner* — Dale E Page
*Assistant Examiner* — John Bodnar
(74) *Attorney, Agent, or Firm* — Harness, Dickey & Pierce, P.L.C.

(57) ABSTRACT

Example embodiments disclose an image sensor and a fabricating method thereof. An image sensor may include a semiconductor layer with a light-receiving region and a light-blocking region, the semiconductor layer including photoelectric conversion devices, a light-blocking layer on a surface of the semiconductor layer, color filters on the semiconductor layer and the light-blocking layer, and micro lenses on the color filters. The color filters are absent from an interface region between the light-receiving region and the light-blocking region.

8 Claims, 16 Drawing Sheets

(56) References Cited

U.S. PATENT DOCUMENTS

| | | |
|---|---|---|
| 8,354,292 B2 | 1/2013 | Park et al. |
| 2004/0241898 A1 | 12/2004 | Sakoh et al. |
| 2007/0045513 A1 | 3/2007 | Lee et al. |
| 2008/0074520 A1 | 3/2008 | Matsuda et al. |
| 2008/0283948 A1 | 11/2008 | Koike |
| 2009/0057537 A1 | 3/2009 | Silsby et al. |
| 2009/0166783 A1 | 7/2009 | Maruyama |
| 2010/0165134 A1* | 7/2010 | Dowski, Jr. ............ B24B 13/06 348/218.1 |
| 2011/0013055 A1* | 1/2011 | Sul et al. ...................... 348/273 |
| 2012/0164783 A1 | 6/2012 | Park et al. |
| 2012/0199930 A1* | 8/2012 | Hayashi ............ H01L 27/1461 257/435 |
| 2014/0014818 A1* | 1/2014 | Cho et al. ................... 250/208.1 |

FOREIGN PATENT DOCUMENTS

| | | |
|---|---|---|
| KR | 10-2005-0094283 A | 9/2005 |
| KR | 10-2009-0072965 A | 7/2009 |
| KR | 10-2010-0037210 A | 4/2010 |

\* cited by examiner

IMAGE SENSOR AND METHOD OF FABRICATING THE SAME

CROSS-REFERENCE TO RELATED APPLICATIONS

This U.S. non-provisional patent application claims priority under 35 U.S.C. §119 to Korean Patent Application No. 10-2013-0138429, filed on Nov. 14, 2013, in the Korean Intellectual Property Office, the entire contents of which are hereby incorporated by reference.

BACKGROUND

Some example embodiments of inventive concepts relate to an image sensor, such as a CMOS image sensor (CIS), and a method of fabricating the same.

An image sensor is a device that converts optical signals into electrical signals. With increased development of the computer and communications industries, image sensors are used in a variety of applications such as digital cameras, camcorders, personal communication systems, gaming machines, security cameras, micro-cameras for medical applications, and/or robots.

The image sensors may be generally classified into charge coupled device (CCD) and complementary metal-oxide semiconductor (CMOS) image sensors. The CMOS image sensors are configured to have signal processing circuits integrated on a single chip. In addition, CMOS image sensors may consume relatively low power, and thus, they are applicable to portable electronic devices. Furthermore, CMOS image sensors can be fabricated using cost-effective CMOS fabrication techniques and can provide high resolution images. Accordingly, the use of CMOS image sensors has increased.

SUMMARY

Example embodiments of inventive concepts provide an image sensor that reduces color distortion.

Other example embodiments of inventive concepts provide a method of fabricating the image sensor.

According to at least some example embodiments of inventive concepts, an image sensor may include a semiconductor layer having a light-receiving region and a light-blocking region, the semiconductor layer including photoelectric conversion devices, a light-blocking layer on a surface of the semiconductor layer and on the light-blocking region, color filters on the semiconductor layer and the light-blocking layer, and micro lenses on the color filters. The color filters are absent from an interface region and the interface region is between the light-receiving region and the light-blocking region.

In at least some example embodiments, the light-blocking region surrounds the light-receiving region, the light-receiving region may include an image region and a dummy region and the dummy region may be between the image region and the light-blocking region.

In at least some example embodiments, the color filters are absent from a portion of the light-blocking region and a portion of the dummy region, and the portion of the light-blocking region and the portion of the dummy region are adjacent to each other.

In at least some example embodiments, a corresponding one of the color filters and a corresponding one of the micro lenses overlap each of the photoelectric conversion devices.

In at least some example embodiments, the image sensor may further include an upper planarization layer between the color filters and the micro lenses, the upper planarization layer being on the interface region, the light-receiving region and the light-blocking region. The upper planarization layer is thicker on the interface region than on portions of the light-receiving and light-blocking regions.

In at least some example embodiments, the image sensor may further include a lower planarization layer between the light-blocking layer and the color filters. The lower planarization layer is exposed on the interface region.

In at least some example embodiments, the image sensor may further include an interconnection layer on an opposite surface of the semiconductor layer. The interconnection layer and the light-blocking layer are spaced apart from each other by the semiconductor layer.

In at least some example embodiments, the image sensor may further include an interconnection layer between the light-blocking layer and the semiconductor layer.

According to at least some example embodiments of inventive concepts, a method of fabricating an image sensor may include forming photoelectric conversion devices in a semiconductor layer, the semiconductor layer having a light-receiving region and a light-blocking region, forming a light-blocking layer on the semiconductor layer to cover the light-blocking region, forming color filters on the light-blocking layer to face the photoelectric conversion devices, respectively, removing at least a portion of the color filters, and forming micro lenses on the remaining color filters, respectively.

In at least some example embodiments, the light-blocking region surrounds the light-receiving region, the light-receiving region includes an image region and a dummy region, and the dummy region may be between the image region and the light-blocking region.

In at least some example embodiments, the removing the portion of the color filters may include forming a photoresist layer on the semiconductor layer and the light-blocking layer, exposing and developing the photoresist layer to form photoresist patterns on pixels, respectively, to form the color pixels and to remove the portion of the color filters, and dyeing the photoresist patterns.

In at least some example embodiments, the removing the portion of the color filters may include forming a photoresist layer on the semiconductor layer and the light-blocking layer, exposing and developing the photoresist layer to form photoresist patterns on pixels, respectively, dyeing the photoresist patterns to form the color filters, forming a mask pattern on the color filters, and removing color filters exposed by the mask pattern.

In at least some example embodiments, the method may further include forming a planarization layer between the light-blocking layer and the color filters. The removing the portion of the color filters exposes a top surface of the planarization layer.

In at least some example embodiments, the method may further include forming an interconnection layer on the semiconductor layer, the semiconductor layer between the interconnection layer and the light-blocking layer.

In at least some example embodiments, the method may further include forming an interconnection layer between the light-blocking layer and the semiconductor layer.

At least one example embodiment discloses an image sensor including a plurality of photoelectric conversion elements, a light transmission layer on the photoelectric conversion elements, the light transmission layer including at least a first filter and at least a second filter, a transition region being between the first filter and the second filter, an upper surface of the first filter being higher than an upper surface of the second filter, and a plurality of micro lenses on the first and second filters, the plurality of micro lenses being absent from the transition region.

In an example embodiment, the light transmission layer includes a third filter in the transition region.

In an example embodiment, the third filter has a first portion and a second portion, a thickness of the first portion being greater than a thickness of the second portion.

In an example embodiment, the light transmission layer includes a lower planarization layer transitioning from a first height in the light transmission layer to a second height in the light transmission layer and a light blocking layer on a portion of the lower planarization layer having the second height.

In an example embodiment, the light transmission layer includes an upper planarization layer on the first filter, the second filter and the lower planarization layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

Figure 1:
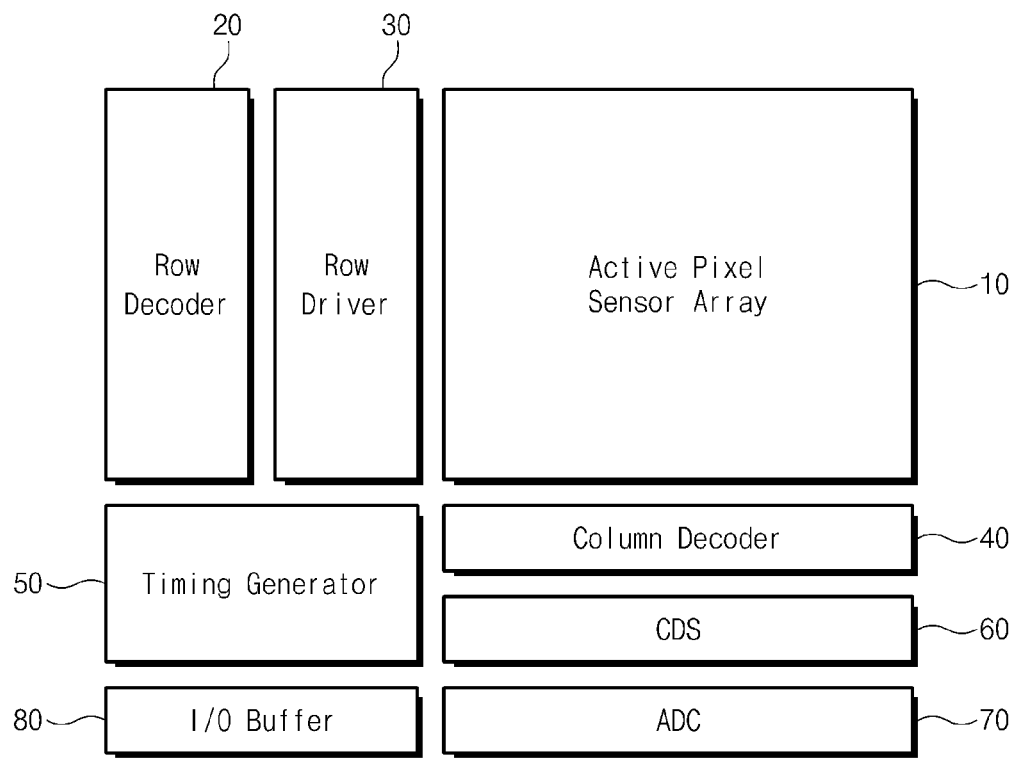
FIG. 1 may be a block diagram of an image sensor according to an example embodiment of inventive concepts.

It should be noted that these figures are intended to illustrate the general characteristics of methods, structure and/or materials utilized in some example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Example embodiments of inventive concepts will now be described more fully with reference to the accompanying drawings, in which example embodiments are shown. Example embodiments of inventive concepts may, however, be embodied in many different forms and should not be construed as being limited to example embodiments set forth herein; rather, example embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments of inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 may be a block diagram of an image sensor according to an example embodiment of inventive concepts. The image sensor may be a CMOS image sensor, but example embodiments of inventive concepts are not limited thereto.

Referring to FIG. 1, the image sensor may include an active pixel sensor array 10, a row decoder 20, a row driver 30, a column decoder 40, a timing generator 50, a correlated double sampler 60, an analog-to-digital converter 70, and an input/output (I/O) buffer 80.

The active pixel sensor array 10 may include a plurality of two-dimensionally arranged unit pixels, each of which is configured to convert optical signals to electrical signals. The active pixel sensor array 10 may be driven by a plurality of driving signals such as a pixel selection signal, a reset signal, and a charge transmission signal from the row driver 30. The converted electrical signal may be provided to the correlated double sampler 60.

The row driver 30 may provide several driving signals for driving several unit pixels of the active pixel sensor array 10 in accordance with a decoded result obtained from the row decoder 20. In the case where the unit pixels are arranged in a matrix shape, the driving signals may be supplied to respective rows.

The timing generator 50 may provide timing and control signals to the row decoder 20 and the column decoder 40.

The correlated double sampler 60 may receive the electric signals generated in the active pixel sensor array 10, and hold and sample the received electric signals. The correlated double sampler 60 may perform a double sampling operation to sample a noise level and a signal level of the electric signal and output a difference level corresponding to a difference between the noise and signal levels.

The analog-to-digital converter 70 may convert analog signals corresponding to the difference level output from the correlated double sampler 60 into digital signals, and then the analog to digital converter 70 outputs the converted digital signals.

The I/O buffer 80 may latch the digital signal and then output the latched digital signals sequentially to an image signal processing unit (not shown) in accordance with the decoding result obtained from the column decoder 40.

Figure 2A:
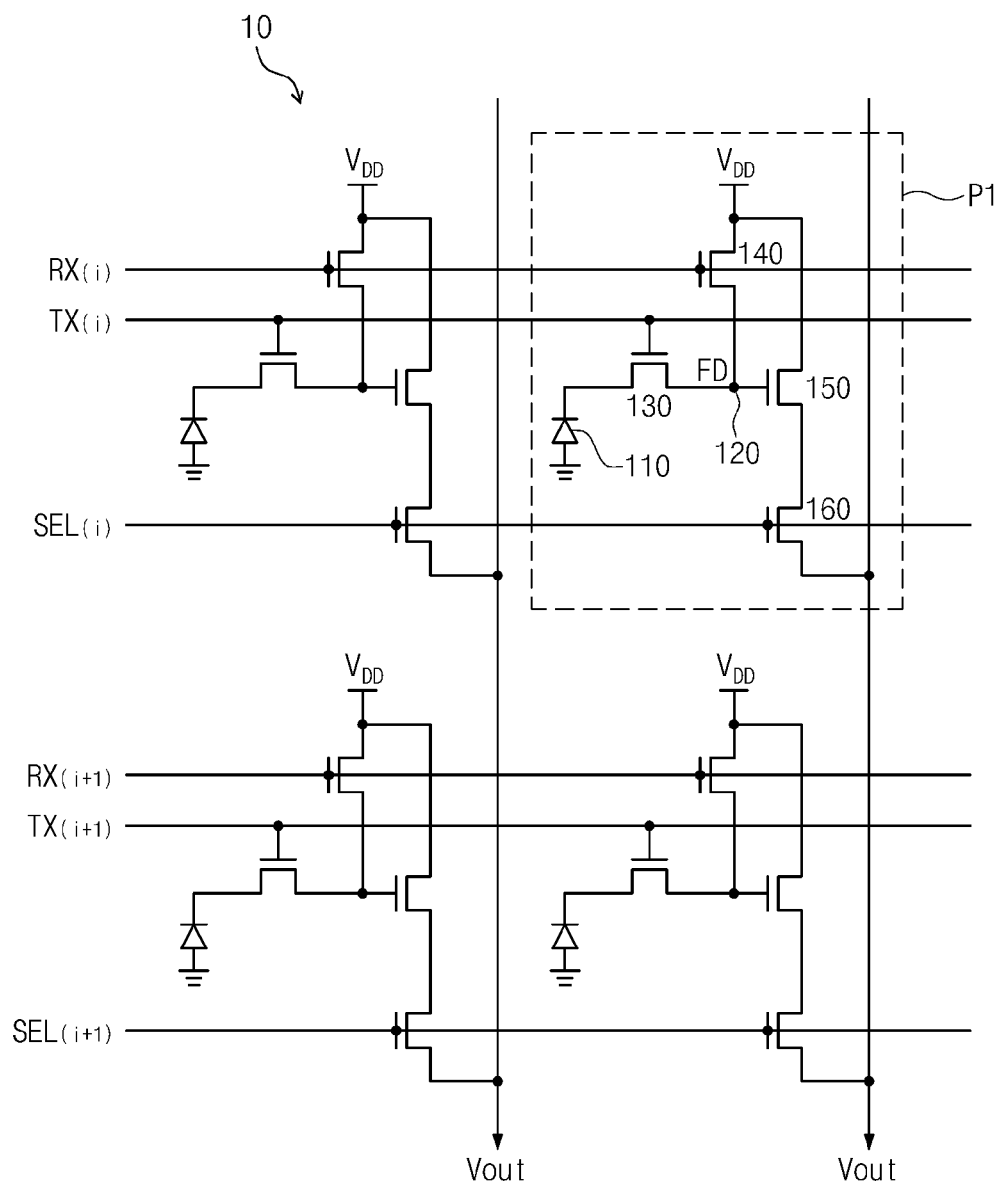
FIGS. 2A and 2B are circuit diagrams illustrating an active pixel sensor array of an image sensor, according to an example embodiment of inventive concepts.
Figure 2B:
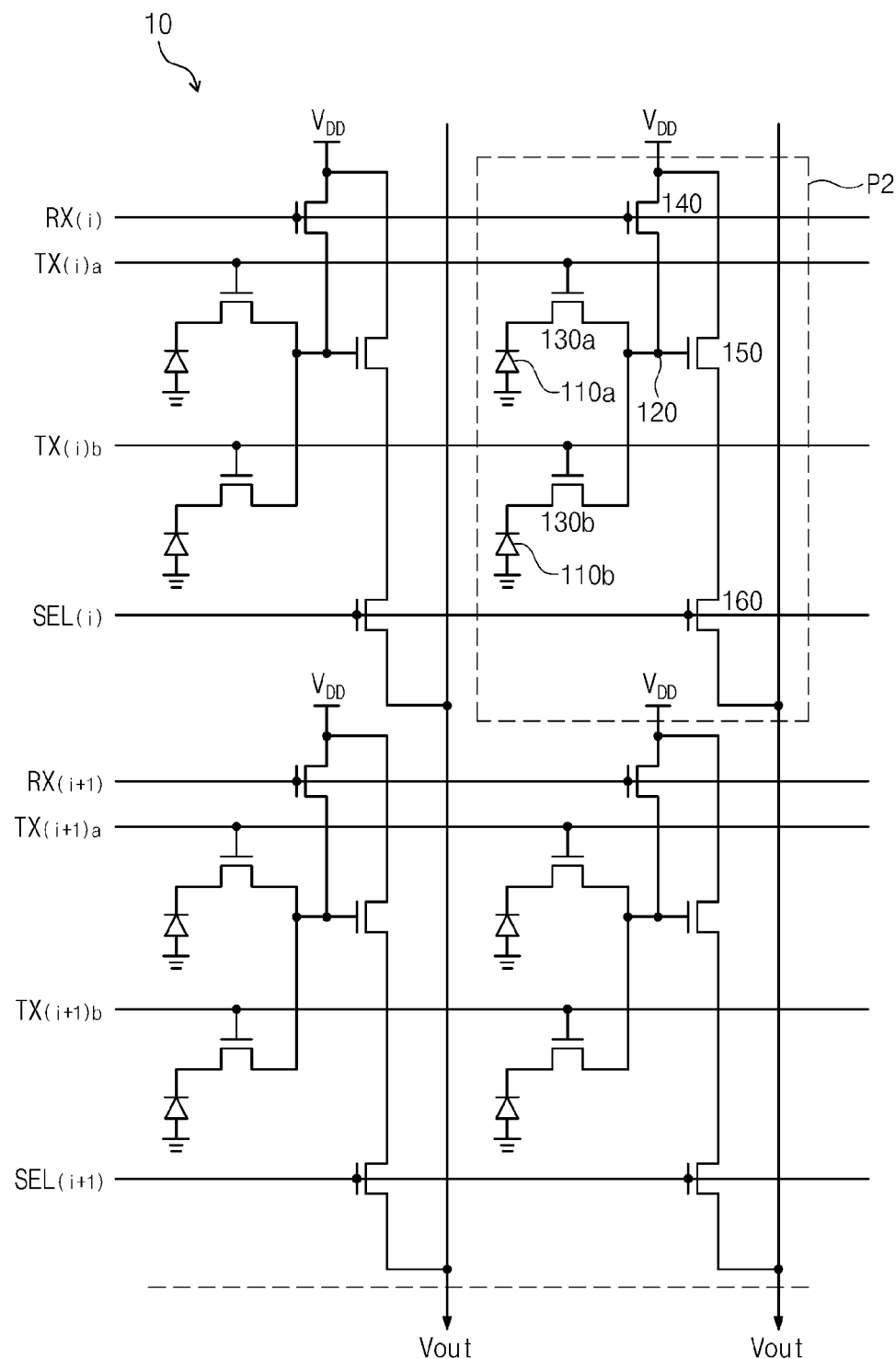

FIGS. 2A and 2B are circuit diagrams illustrating an active pixel sensor array of an image sensor, according to example embodiments of inventive concepts.

The active pixel sensor array 10 may include a plurality of unit pixels, which may be arranged in the form of a matrix form. In example embodiments, each of the unit pixels may include at least one photoelectric conversion device (110 in FIG. 2A, 110a and 110b in FIG. 2B), which is configured to generate electric charges from light incident thereto and store the generated electric charges, and a reading device, which is configured to read an optical signal generated in the photoelectric conversion device. The reading device may include a reset element 140, an amplification element 150, and a selection element 160.

FIG. 2A illustrates a plurality of unit pixels, each of which includes four N-channel MOS transistors. Referring to FIG. 2A, each unit pixel P1 may be composed of a single photoelectric conversion device 110 and four MOS transistors 130, 140, 150, and 160. Alternatively, the unit pixel P1 may be composed of three MOS transistors or five MOS transistors.

More specifically, the photoelectric conversion device 110 may be configured to generate and store charges corresponding to the incident light. In some example embodiments, the photoelectric conversion device 110 may be realized by a photo diode, a photo transistor, a photo gate, a pinned photo diode (PPD), or any combination thereof. In the present example embodiment, the photo diode may be used as the photoelectric conversion device 110. The photoelectric conversion device 110 may be connected to a charge transmission element 130 transmitting the stored charges to a detection area 120.

The detection area 120 may be a floating diffusion region FD, which is provided in the semiconductor layer and is doped with N-type impurities. The floating diffusion region FD may receive the charges stored in the photoelectric conversion device 110 to accumulate charges therein. The detection area 120 (e.g., the floating diffusion region FD) may be electrically connected to the amplification element 150 to control the amplification element 150.

The charge transmission element 130 may transmit the charges stored in the photoelectric conversion device 110 to the detection area 120. The charge transmission element 130 may generally be composed of one MOS transistor and may be controlled by a bias applied to a charge transmission signal line TX(i).

The reset element 140 may periodically reset the detection area 120 and may be composed of one MOS transistor. A source of the reset element 140 may be connected to the detection area 120 and a drain of the reset element 140 may be connected to a power supply terminal applied with a power supply voltage $V_{DD}$. The reset element 140 may be driven by a bias applied to a reset signal line RX(i). In the case where the reset element 140 is turned on by the bias applied to the reset signal line RX(i), the power supply voltage $V_{DD}$ may be applied to the detection area 120. Therefore, the detection area 120 may be reset, when the reset element 140 is turned on.

In conjunction with a static current source (not shown) located outside the unit pixel P1, the amplification element 150 may serve as a source follower buffer amplifier. For example, the amplification element 150 may amplify a variation in electric potential of the detection area 120, and then, output the amplified signal to an output line $V_{out}$ through the selection element 160.

The selection elements 160 may be configured to be able to select each row of the unit pixels P1 in a reading operation and may be composed of one MOS transistor. The selection elements 160 in each row may be driven by a bias applied to a row select signal line SEL(i). In the case where the selection elements 160 are turned on by the bias applied to the row select signal line SEL(i), the output signals of the amplification elements 150 composed of the MOS transistors may be transmitted to the output lines $V_{out}$ through the selection element 160.

The driving signal lines TX(i), RX(i), and SEL(i) may be electrically connected to the charge transmission elements 130, the reset elements 140, and the selection elements 160, respectively. The driving signal lines TX(i), RX(i), and SEL(i) may extend in a row direction (horizontal direction) so as to simultaneously drive the unit pixels arrayed in the same row.

FIG. 2B illustrates an example of a paired pixel, in which two photoelectric conversion devices are configured to share the reading device. According to an example embodiment shown in FIG. 2B, the active pixel sensor array 10 may include a plurality of paired pixels P2, which are arranged in the matrix form. Each of the paired pixels P2 may be configured in such a way that a reading device is shared by a pair of photoelectric conversion devices 110a and 110b. For example, the pair of the photoelectric conversion devices 110a and 110b may share the reset element 140, the amplification element 150, and/or the selection element 160. Further, each of the photoelectric conversion devices 110a and 110b may be connected to charge transmission elements 130a and 130b, respectively, which may be used to transfer accumulated charges to other components (e.g., the reading device).

A bias applied to the row selection line SEL(i) may allow the selection element 160 to select each row of the paired pixels P2 in a reading operation. Further, in the case where biases are applied to the charge transmission elements 130a and 130b through transmission lines TX(i)a and TX(i)b, charges can be transferred from one of two photoelectric conversion devices 110a and 110b to the detection area 120.

Figure 3A:
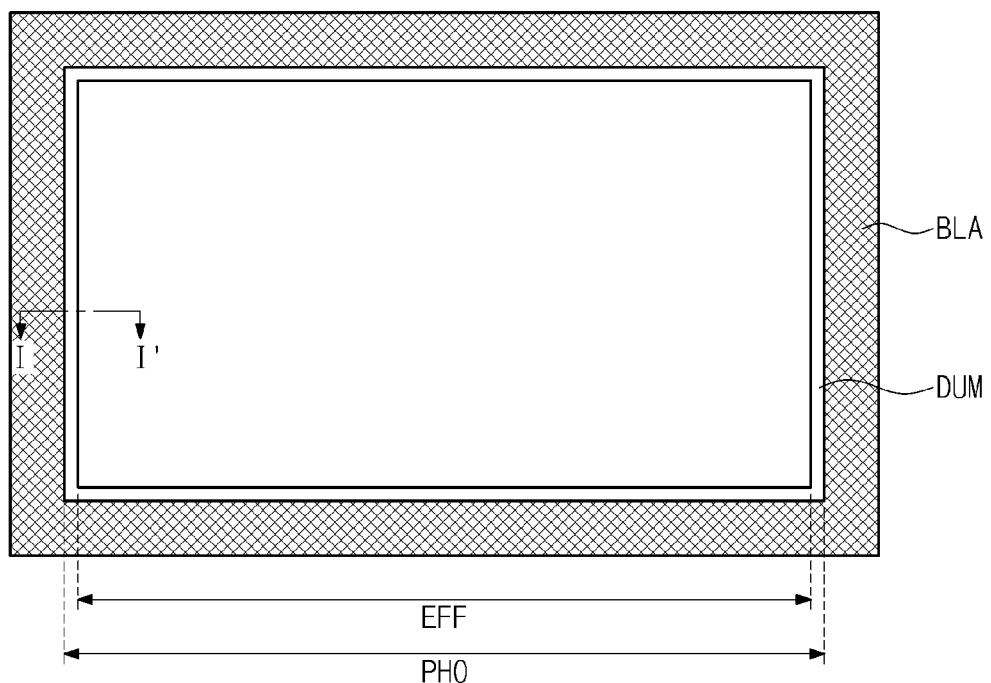
FIG. 3A is a plan view of an image sensor according to example embodiments of inventive concepts.
Figure 3B:
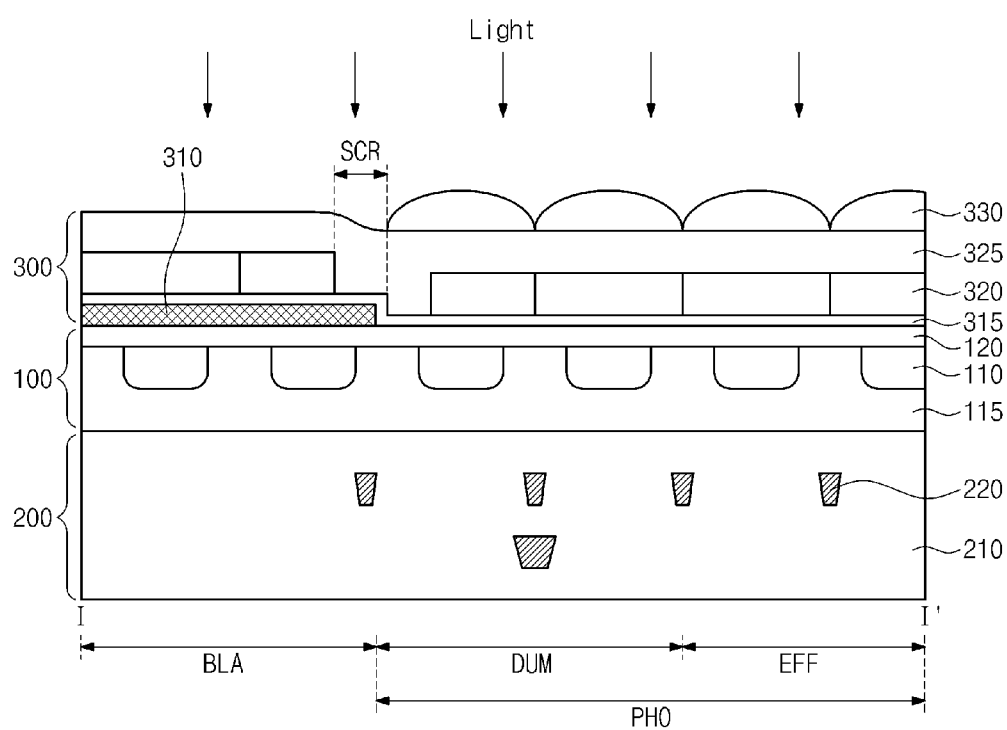
FIGS. 3B through 3D are sectional views of the image sensor taken along line I-I' of FIG. 3A.

FIG. 3A is a plan view of an image sensor according to an example embodiment of inventive concepts, and FIG. 3B is a sectional view of the image sensor taken along line I-I' of FIG. 3A.

Referring to FIGS. 3A and 3B, the image sensor may include a light-receiving region PHO and a light-blocking region BLA. In an example embodiment, the light-receiving region PHO may be provided at a central region of the image sensor, and the light-blocking region BLA may be provided around the light-receiving region PHO or at an edge region of the image sensor.

The light-receiving region PHO may include an effective image region EFF and a dummy region DUM. The dummy region DUM may be disposed between the effective image region EFF and the light-blocking region BLA. In the light-receiving region PHO, a plurality of active pixels may be provided on each or both of the effective image region EFF and the dummy region DUM. The effective image region EFF may be configured to generate image signals from an incident light, while the dummy region DUM may be provided to process the image signals generated from the effective image region EFF.

Devices in the light-blocking region BLA may be operated under black or dark environment. Thus, signals generated in the light-blocking region BLA may serve as a reference signal having no dependence on the incident light. For example, for the image sensor converting optical signals to electric signals, it is necessary to remove an environmental effect (i.e., noise), which may be caused by, for example, thermal electrons in the photoelectric conversion devices 110. For this, the light-blocking region BLA, in which photoelectric conversion effect can be prevented, is provided in the image sensor, in addition to the light-receiving region PHO. Further, in order to remove the environmental effect from the image, an amount of electric charges generated in a pixel of the light-blocking region BLA is subtracted from an amount of electric charges generated in each active pixel of the light-receiving region PHO. Further, to prevent the light from being incident into the light-blocking region BLA, a light-blocking layer (e.g., of metal) may be provided on the whole top surface of the light-blocking region, while the pixel in the light-blocking region may be configured to have the same feature as the active pixel.

Referring to FIG. 3B, the image sensor may include a semiconductor layer 100, an interconnection layer 200, and a light-transmission layer 300.

In an example embodiment, the semiconductor layer 100 may have first and second surfaces facing each other. The interconnection layer 200 may be provided on the first surface of the semiconductor layer 100, and the light-transmission layer 300 may be provided on the second surface of the semiconductor layer 100.

The semiconductor layer 100 may be configured to include a bulk silicon wafer of a first conductivity type (e.g., P-type) and an epitaxial layer 115 of the first conductivity type on the bulk silicon wafer. In other example embodiments, the semiconductor layer 100 may include only the P-type epitaxial layer 115 without the bulk silicon wafer. In still other example embodiments, the semiconductor layer 100 may be a bulk semiconductor wafer, in which a well region of the first conductivity type is provided. In yet other example embodiments, the semiconductor layer 100 may include an N-type epitaxial layer, a bulk silicon wafer, a silicon-on-insulator (SOI) wafer, and so forth.

In the case where an external light is incident into the semiconductor layer 100, a penetration depth of the incident light into the semiconductor layer 100 may vary depending on a wavelength of the incident light. In this respect, a thickness of the semiconductor layer 100 may be determined in consideration of the wavelength of the light incident into the photoelectric conversion devices 110.

A device isolation layer (not shown) may be formed in the semiconductor layer 100 to define active regions. For example, referring to FIGS. 2A and 2B, the device isolation layer may be formed to define a first active region for the photoelectric conversion device 110 and a second active region for the reading device. However, shapes and disposition of the first and second active regions may not be limited thereto.

In the semiconductor layer 100, the photoelectric conversion devices 110 may be arranged in a matrix shape, when viewed in plan view. For example, each of the photoelectric conversion devices 110 may be shaped like a rectangle or tetragon, when viewed in plan view. Each of the photoelectric conversion devices 110 may be provided in the form of a photo diode, a photo transistor, a photo gate, or a pinned photo diode (PPD).

The interconnection layer 200 may include several devices, which may be configured to read out electrical signals generated from the photoelectric conversion devices 110 and to control the unit pixels.

In an example embodiment, the interconnection layer 200 may include an interlayered insulating layer 210, which is provided to have a multi-layered structure, and a plurality of metal lines 220, which are vertically stacked in the interlayered insulating layer 210. The metal lines 220 may be connected to reading and logic devices through contact plugs (not shown). In an example embodiment, the metal lines 220 may be provided without dependence on the arrangement of the photoelectric conversion devices 110. For example, the metal lines 220 may be provided to cross over the photoelectric conversion devices 110.

In some example embodiments, the interconnection layer 200 may be formed to be interposed between the semiconductor layer 100 and a supporting substrate (not shown). The supporting substrate may include at least one of a semiconductor substrate, a glass substrate, and a plastic substrate. The supporting substrate may be bonded to the interconnection layer 200 by an adhesive layer. The use of the supporting substrate makes it possible to prevent the semiconductor layer 100 from being bent or curved when the semiconductor layer 100 is thinned.

The light-transmission layer 300 may be provided on the second surface of the semiconductor layer 100 and include a light-blocking layer 310, color filters 320, and micro lenses 330.

The light-blocking layer 310 may be formed on the light-blocking region BLA. For example, the light-blocking layer 310 may be formed to be overlapped with the light-blocking region BLA, when viewed in plan view. The light-blocking layer 310 may be formed of a metal-containing layer (e.g., of copper).

The color filters 320 may be overlapped with the photoelectric conversion devices 110, respectively, when viewed in plan view. For example, the color filter 320 may be disposed to realize red, green or blue, in accordance with a position or structure of the unit pixel. Further, the color filters 320 may be two-dimensionally arranged, similar or identical to the arrangement of the photoelectric conversion devices 110.

In an example embodiment, the color filters 320 may be disposed to form a Bayer-type RGB pixel arrangement. To realize a color image, each of the color filters 320 may be configured in such a way that light having a specific wavelength can be incident into a corresponding one of the unit pixels. For example, the color filters 320 may include red, green, and blue color filters, which filter the incident light and allow red, green, and blue lights, respectively, to transmit therethrough. In other example embodiments, the color filters 320 may be configured to realize other color system including cyan, magenta, or yellow.

Due to the presence of the light-blocking layer 310, there may be a height difference between the color filters 320 provided on the light-blocking and light-receiving regions BLA and PHO. In an example embodiment, some of the color filters 320 may be removed to avoid technical problems caused by the height difference. For example, some of the color filters 320 may be removed from an interface region SCR (hereinafter, referred as to a "staircase region") between the light-blocking and light-receiving regions BLA and PHO. In other words, the color filters 320 may be absent from the staircase region SCR. The staircase region SCR for the removal of the color filters 320 may include at least a portion of the light-blocking region BLA and a portion of the dummy region DUM, as will be described in more detail below.

The micro lenses 330 may be provided on the color filters 320 to face or overlap the unit pixels, respectively, when viewed in plan view. Each of the micro lenses 330 may have an upward-convex shape with a specific curvature radius. The micro lenses 330 may be formed of an optically-transparent resin. Each of the micro lenses 330 makes it possible to focus the incident light on a corresponding one of the photoelectric conversion devices 110. For example, even when a fraction of the incident light is oriented toward a region beyond the photoelectric conversion device 110, it can be incident into the photoelectric conversion device 110, by virtue of the micro lens 330. As shown, the micro lenses 330 may be disposed on the light-receiving region PHO, but example embodiments of inventive concepts are not be limited thereto. For example, the micro lenses 330 may be provided on both of the light-blocking and light-receiving regions BLA and PHO.

As described above, the presence of the light-blocking layer 310 may result in the height difference between the light-blocking and light-receiving regions BLA and PHO. In the case where the color filters 320 are not removed from the staircase region SCR, the micro lens 330 on the staircase region SCR may have a sloped or curved bottom surface and this makes it difficult to focus the incident light on the corresponding photoelectric conversion device 110. In this respect, the removal of the color filters 320 on the staircase region SCR makes it possible to prevent technical problems, which may be caused by the micro lens 330 with the curved bottom surface. That is, it is possible to focus effectively the incident light on the photoelectric conversion device 110. As a result, the image sensor can be configured to have high image quality without color distortion.

Optionally, a lower planarization layer 315 may be provided between the semiconductor layer 100 and the color filters 320. Further, an upper planarization layer 325 may be provided between the color filters 320 and the micro lenses 330. The lower and upper planarization layers 315 and 325 may be formed of a material with a refractive index higher than that of silicon oxide, and this makes it possible to improve light sensitivity of the image sensor. For example, the lower and upper planarization layers 315 and 325 may be formed of or include a material with a refractive index of about 1.4-4.0. For example, the lower and upper planarization layers 315 and 325 may be formed of aluminum oxide ($Al_2O_3$), cerium fluoride ($CeF_3$), hafnium oxide ($HfO_2$), indium tin oxide (ITO), magnesium oxide (MgO), tantalum pentoxide ($Ta_2O_5$), tin oxide ($TiO_2$), zirconium dioxide ($ZrO_2$), silicon (Si), germanium (Ge), zinc selenide (ZnSe), zinc sulfide (ZnS), or lead fluoride ($PbF_2$). In another case, the lower and upper planarization layers 315 and 325 may be formed of an organic material with a high refractive index, for example, siloxane resin, benzocyclobutene (BCB), polyimide materials, acrylic materials, parylene C, poly(methyl methacrylate) (PMMA), and polyethylene terephthalate (PET). Further, the lower and upper planarization layers 315 and 325 may be formed of or include, for example, strontium titanate ($SrTiO_3$), polycarbonate, glass, bromine, sapphire, cubic zirconia, potassium Niobate ($KNbO_3$), silicon carbide (SiC), gallium (III) phosphide (GaP), or gallium (III) arsenide (GaAs).

Figure 3C:
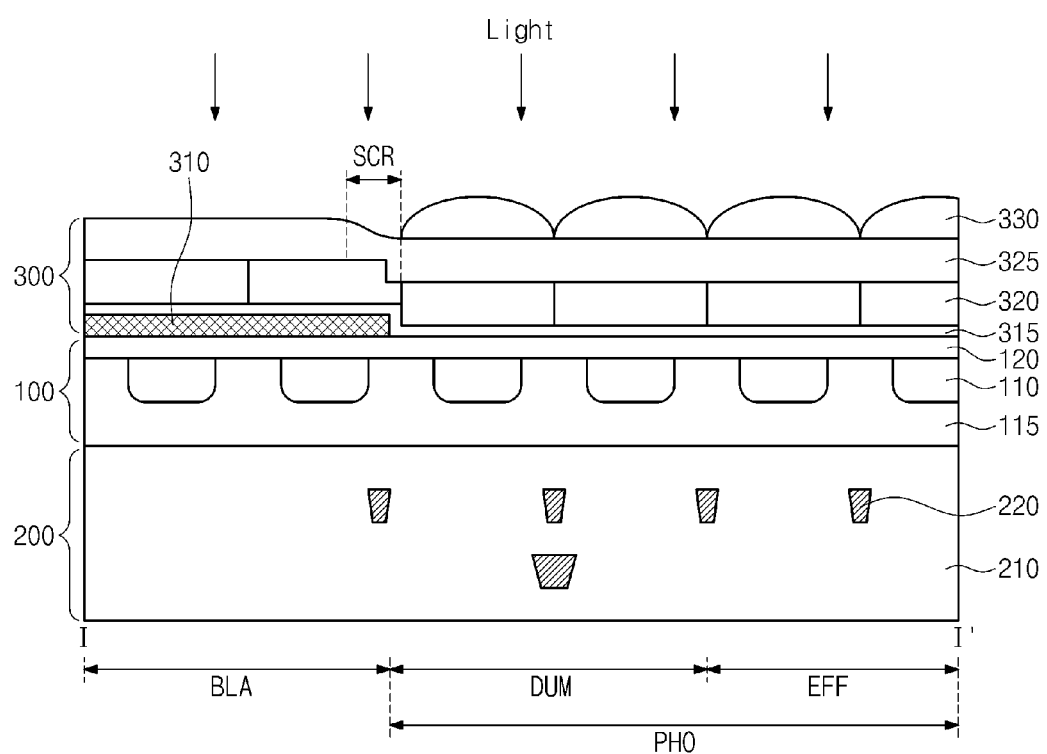

FIG. 3C is a sectional view of an image sensor according to another example embodiment of inventive concepts. Here, the sectional view of FIG. 3C may illustrate a portion of the image sensor taken along line I-I' of FIG. 3A.

Referring to FIGS. 3A and 3C, the image sensor may include the light-receiving region PHO and the light-blocking region BLA, and the light-receiving region PHO may include the effective image region EFF and the dummy region DUM. The image sensor may include the semiconductor layer 100, the interconnection layer 200, and the light-transmission layer 300. In an example embodiment, the semiconductor layer 100 may include first and second surfaces facing each other. Here, the interconnection layer 200 may be provided on the first surface of the semiconductor layer 100, and the light-transmission layer 300 may be provided on the second surface of the semiconductor layer 100.

As shown in FIG. 3C, due to the presence of the light-blocking layer 310, there may be a height difference between the color filters 320 provided on the light-blocking and light-receiving regions BLA and PHO. Some of the color filters 320 on the staircase region SCR between the light-blocking and light-receiving regions BLA and PHO may be etched.

Like this, the removal of the color filters 320 on the staircase region SCR makes it possible to prevent technical problems, which may be caused by the curved bottom surface of the micro lens 330 on the staircase region SCR.

Except for the above described differences, the image sensor of FIG. 3C may be configured to have substantially the same features as that of FIG. 3B. Thus, a detailed description of the image sensor of FIG. 3C will be omitted.

Figure 3D:
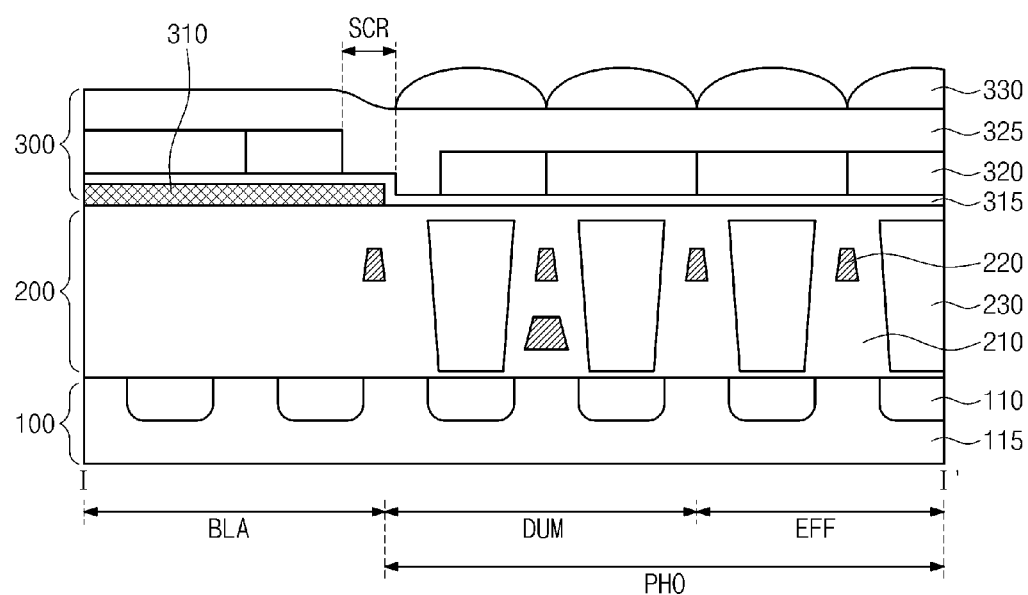

FIG. 3D is a sectional view of an image sensor according to still another example embodiment of inventive concepts. Here, the sectional view of FIG. 3D may illustrate a portion of the image sensor taken along line I-I' of FIG. 3A.

Referring to FIGS. 3A and 3D, the image sensor may include the light-receiving region PHO and the light-blocking region BLA, and the light-receiving region PHO may include the effective image region EFF and the dummy region DUM. The image sensor may include the semiconductor layer 100, the interconnection layer 200, and the light-transmission layer 300.

In an example embodiment, the interconnection layer 200 may include first and second surfaces facing each other. Here, the semiconductor layer 100 may be provided on the first surface of the interconnection layer 200, and the light-transmission layer 300 may be provided on the second surface of the interconnection layer 200.

The light-transmission layer 300 and the semiconductor layer 100 may be spaced apart from each other with the interconnection layer 200 interposed therebetween. In an example embodiment, light-guiding patterns 230 may be provided in the interconnection layer 200. Each of the light-guiding patterns 230 may be provided to face or overlap a corresponding one of the photoelectric conversion devices 110, when viewed in plan view, and thereby to guide the light incident from a corresponding one of the color filters 320 to the corresponding one of the photoelectric conversion devices 110. The light-guiding patterns may be formed of or include a material, whose refractive index is higher than that of the interlayered insulating layer 210 in the interconnection layer 200. The light-guiding patterns 230 may be formed of or include silicon oxynitride or silicon oxide.

The image sensor of FIG. 3D may be configured to have substantially the same features as that of FIG. 3B, except for the above described differences (e.g., the presence of the light-guiding patterns 230 and the arrangement of the semiconductor layer 100, the interconnection layer 200, and the light-transmission layer 300). Thus, a detailed description of the image sensor of FIG. 3D will be omitted.

FIGS. 4 through 9 are sectional views illustrating a method of fabricating an image sensor, according to example embodiments of inventive concepts.

Figure 4:
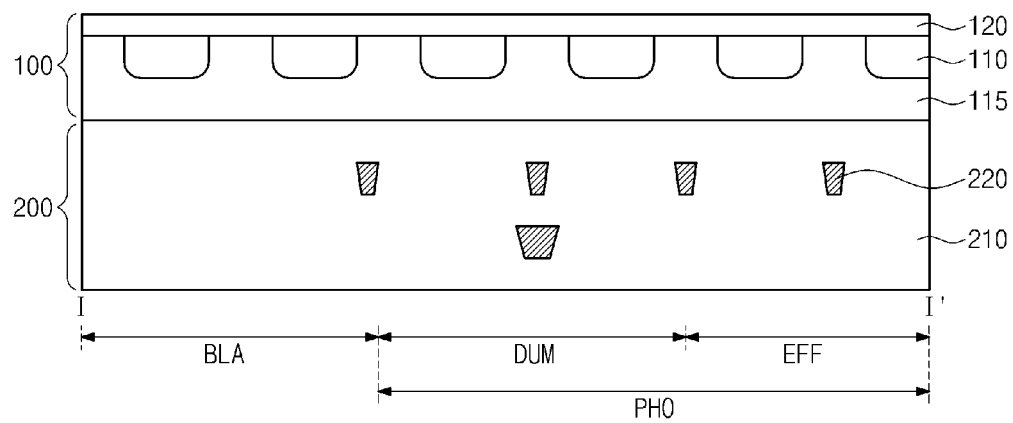
FIG. 4 is a sectional view of a method of fabricating an image sensor, according to example embodiments of inventive concepts.

Referring to FIG. 4, the semiconductor layer 100 may be provided to include the photoelectric conversion device 110, and the interconnection layer 200 may be provided on a surface of the semiconductor layer 100.

For example, the semiconductor layer 100 may be provided to include a p-type epitaxial layer 115, which may be formed on a p-type bulk wafer. Hereinafter, an exposed surface of the p-type epitaxial layer 115 will be referred to as a first surface of the semiconductor layer 100, while an exposed surface of the p-type bulk wafer will be referred to as a second surface of the semiconductor layer 100. The semiconductor layer 100 may include the p-type bulk wafer and the p-type epitaxial layer 115 grown from the p-type bulk wafer, but example embodiments of inventive concepts are not be limited thereto. The device isolation layer may be formed in the semiconductor layer 100 to define the active regions. The photoelectric conversion device 110 may be formed in the active regions of the semiconductor layer 100, which may be formed adjacent to the first surface. Each of the photoelectric conversion devices 110 may be provided in the form of a photo diode, a photo transistor, a photo gate, or a pinned photo diode (PPD).

The interconnection layer 200 may be formed on the second surface of the semiconductor layer 100. For example, the formation of the interconnection layer 200 may include forming the interlayered insulating layer 210, depositing a metal layer on the interlayered insulating layer 210, and then, patterning the metal layer to form the metal lines 220. The metal lines 220 may be connected to each other or to a control device on the semiconductor layer 100 through, for example, contact plugs (not shown). In another example embodiment, the interconnection layer 200 may be formed using a damascene process. For example, the formation of the interconnection layer 200 may include patterning the interlayered insulating layer 210, depositing a metal layer on the patterned interlayered insulating layer 210, and then, performing a planarization process to form the metal lines 220 and/or the contact plugs. The metal line 220 may be formed of, for example, copper (Cu), aluminum (Al), tungsten (W), titanium (Ti), molybdenum (Mo), tantalum (Ta), titanium nitride (TiN), tantalum nitride (TaN), zirconium nitride (ZrN), tungsten nitride (WN), or any alloys thereof.

In an example embodiment, the insulating layer 120 may be formed on the first surface of the semiconductor layer 100. The insulating layer 120 may be formed of or include an optically-transparent material (e.g., silicon oxide).

A supporting substrate (not shown) may be bonded on the interconnection layer 200. In a subsequent thinning process of the semiconductor layer 100, the supporting substrate may support the semiconductor layer 100 and prevent devices formed on the semiconductor layer 100 from being deformed. A bulk wafer or a plastic substrate may be used as the supporting substrate. Thereafter, the thinning process may be performed to the semiconductor layer 100 to reduce a thickness of the semiconductor layer 100. In the case where the image sensor is configured in such a way that light is incident into the semiconductor layer 100 through the second surface thereof, the larger a thickness of the semiconductor layer 100, the larger the loss of the incident light.

In this respect, a propagation length of the light to be incident into the photoelectric conversion devices 110 can be reduced by thinning the semiconductor layer 100, and this makes it possible to improve light sensitivity of the photoelectric conversion device 110. Further, since a penetration depth of the incident light in the semiconductor layer 100 varies depending on the wavelength of the incident light, the thinning of the semiconductor layer 100 may be controlled in consideration of the wavelength of the incident light.

The thinning process of the semiconductor layer 100 may include grinding or polishing the bulk wafer, and then, anisotropically and isotropically etching the bulk wafer. For example, a grinder or chemical-mechanical polishing (CMP) apparatus may be used to remove mechanically a portion of the bulk wafer, and then, an anisotropic or isotropic etching process may be performed to adjust precisely a final thickness of the semiconductor layer 100. For example, the etching process of the semiconductor layer 100 may be performed, in a wet etching manner, using mixture solution containing hydrogen fluoride (HF), nitric acid ($HNO_3$), and acetic acid ($CH_3COOH$).

Figure 5:
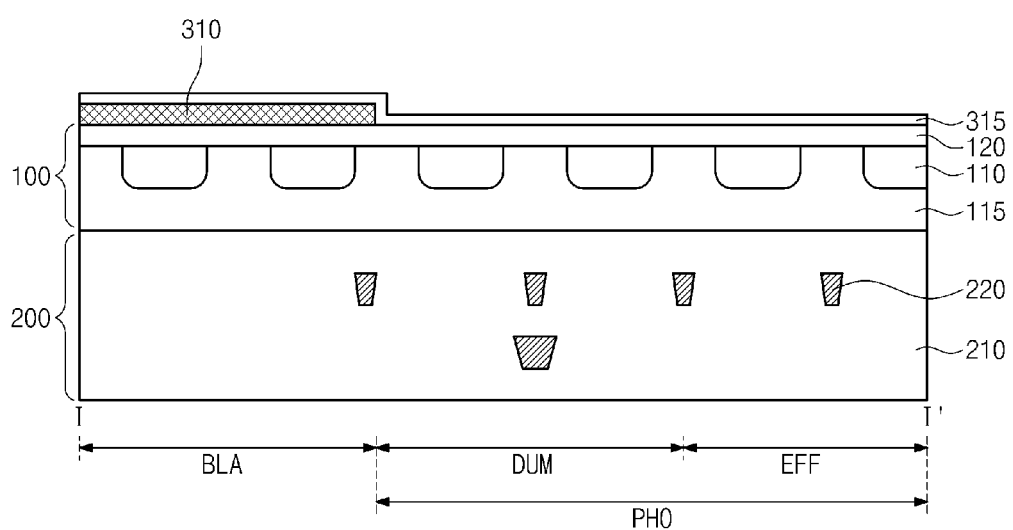
FIG. 5 is a sectional view of a method of fabricating an image sensor, according to example embodiments of inventive concepts.

Referring to FIG. 5, the light-blocking layer 310 may be formed on the light-blocking region BLA.

The light-blocking layer 310 may be formed on an insulating layer to be overlapped with the light-blocking region BLA, when viewed in plan view. The light-blocking layer 310 may be formed of a metal-containing layer (e.g., of copper).

In an example embodiment, the lower planarization layer 315 may be formed on the light-blocking layer 310 and the insulating layer. The lower planarization layer 315 may be formed of or include an optically-transparent material (e.g., silicon oxide). Due to the presence of the light-blocking layer 310, the lower planarization layer 315 may have a stepwise profile on the staircase region SCR between the light-blocking and light-receiving regions BLA and PHO.

The lower planarization layer 315 may be formed of a material with a refractive index higher than that of silicon oxide, and this makes it possible to improve light sensitivity of the image sensor. In an example embodiment, the lower planarization layer 315 may be formed of or include a material with a refractive index of about 1.4-4.0. For example, the lower planarization layer 315 may be formed of $Al_2O_3$, $CeF_3$, $HfO_2$, ITO, MgO, $Ta_2O_5$, $TiO_2$, $ZrO_2$, Si, Ge, ZnSe, ZnS or $PbF_2$. In another example embodiment, the lower planarization layer 315 may be formed of an organic material with a high refractive index, for example, siloxane resin, benzocyclobutene (BCB), polyimide materials, acrylic materials, parylene C, poly(methyl methacrylate) (PMMA), and polyethylene terephthalate (PET).

Figure 6:
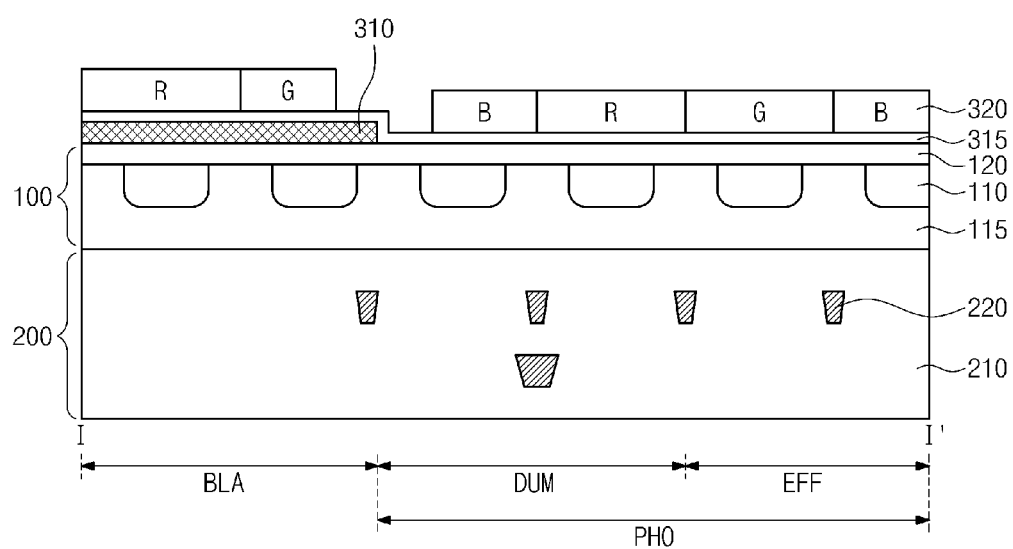
FIG. 6 is a sectional view of a method of fabricating an image sensor, according to example embodiments of inventive concepts.

Referring to FIG. 6, the color filters 320 may be formed on the lower planarization layer 315, and some of the color filters 320 may be removed from the staircase region SCR between the light-blocking and light-receiving regions BLA and PHO. In an example embodiment, some of the color filters 320 located on or near the staircase region SCR between the light-receiving region PHO and the light-blocking region BLA may be partially or wholly removed to expose a portion of the lower planarization layer 315.

Each of the color filters 320 may be formed to face or overlap a corresponding one of the photoelectric conversion devices 110, when viewed in plan view. The color filters 320 may be formed using a dyeing process, a pigment dispersion process, a printing process or the like. The respective color filters 320 may be formed of a photoresist layer dyed with a color corresponding to the respective unit pixels. For example, each of the color filters 320 may be formed to display any one of red, green, and blue. Alternatively, each of the color filters 320 may be formed to display any one of cyan, magenta, or yellow. The color filters 320 may be two dimensionally disposed to have the same or similar arrangement as that of the photoelectric conversion devices 110. In some example embodiments, the color filters 320 may be disposed to form a Bayer-type RGB pixel arrangement.

Hereinafter, the formation and partial removal of the color filters 320 will be described in more detail with reference to FIGS. 7A through 7C.

Figure 7A:
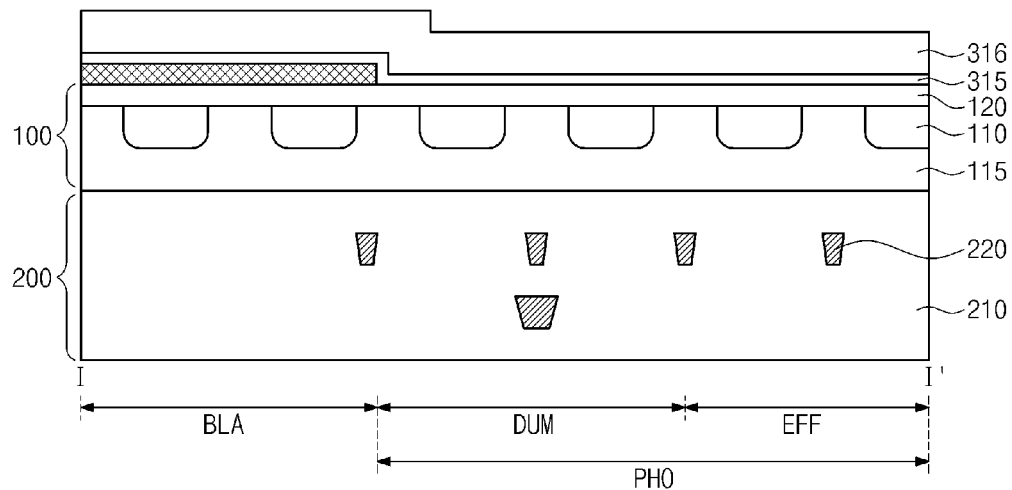
FIGS. 7A through 7C are sectional views illustrating a process of forming color filters, according to example embodiments of inventive concepts.
Figure 7B:
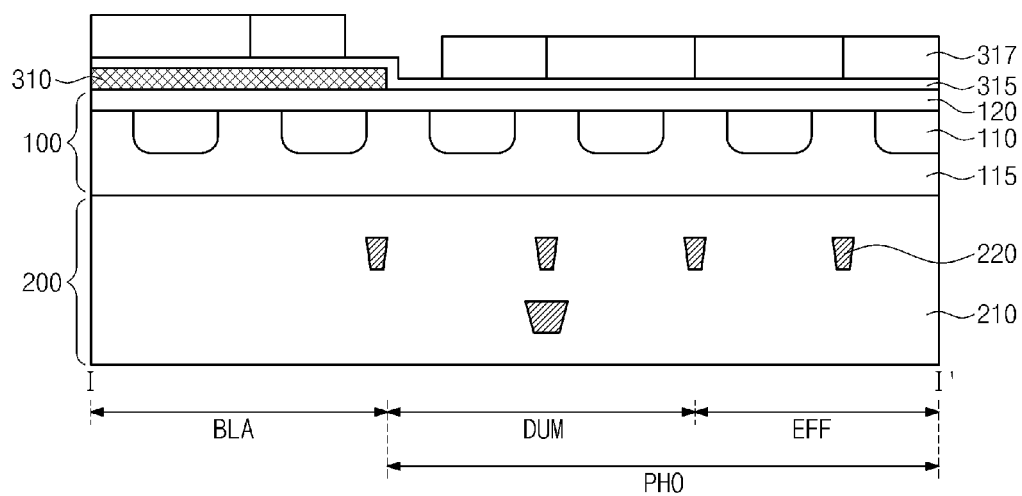
Figure 7C:
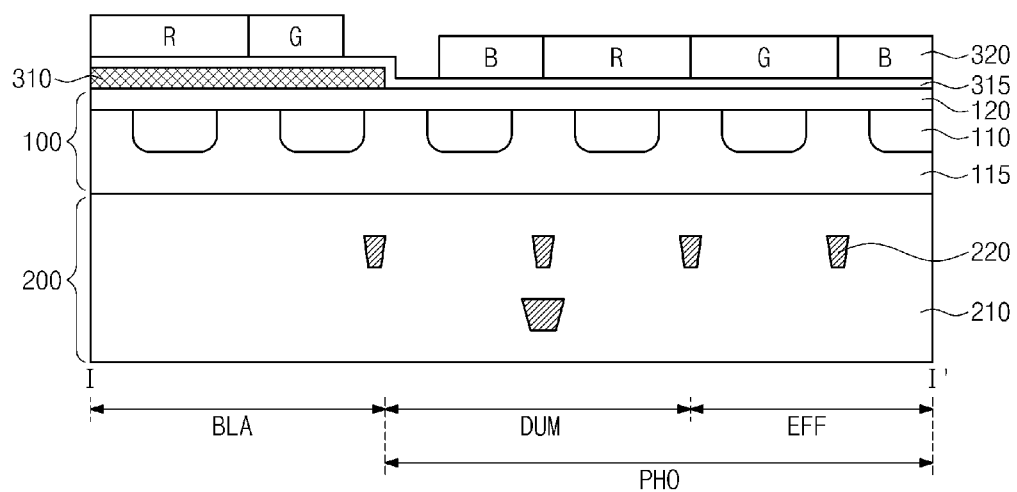

FIGS. 7A through 7C are sectional views illustrating a process of forming color filters, according to example embodiments of inventive concepts.

Referring to FIG. 7A, a photoresist layer 316 may be formed on the lower planarization layer 315. Due to the light-blocking layer 310 on the light-blocking region BLA, the photoresist layer 316 may be formed to have a stepwise structure on the staircase region SCR. In detail, the lower planarization layer 315 may be formed to have the stepwise structure because of the presence of the light-blocking layer 310 locally disposed on the light-blocking region BLA, and the photoresist layer 316 may be formed to have the stepwise structure due to the stepwise structure of the lower planarization layer 315.

Referring to FIG. 7B, an exposing and developing process may be performed to the photoresist layer 316 to form photoresist patterns 317, each of which faces a corresponding one of the unit pixels. In an example embodiment, the exposing and developing process may be performed to a portion of the photoresist layer 316 located on the staircase region SCR, and thus, the portion of the photoresist layer 316 located on the staircase region SCR may be removed. In this case, the removal of the color filters 320 may be achieved without any additional etching process.

Referring to FIG. 7C, a dyeing process to the photoresist patterns 317 may be performed to form the color filters 320. Each of the photoresist patterns 317 may be dyed to have a specific color in accordance with a corresponding pixel.

FIGS. 8A through 8D are sectional views illustrating a process of forming color filters, according to other example embodiments of inventive concepts.

Figure 8A:
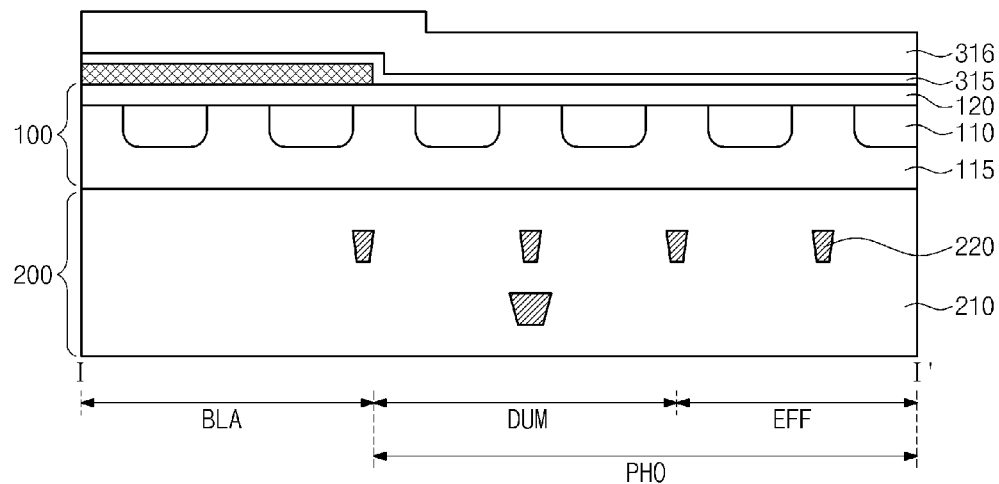
FIGS. 8A through 8D are sectional views illustrating a process of forming color filters, according to other example embodiments of inventive concepts.

Referring to FIG. 8A, the photoresist layer 316 may be formed on the lower planarization layer 315.

Figure 8B:
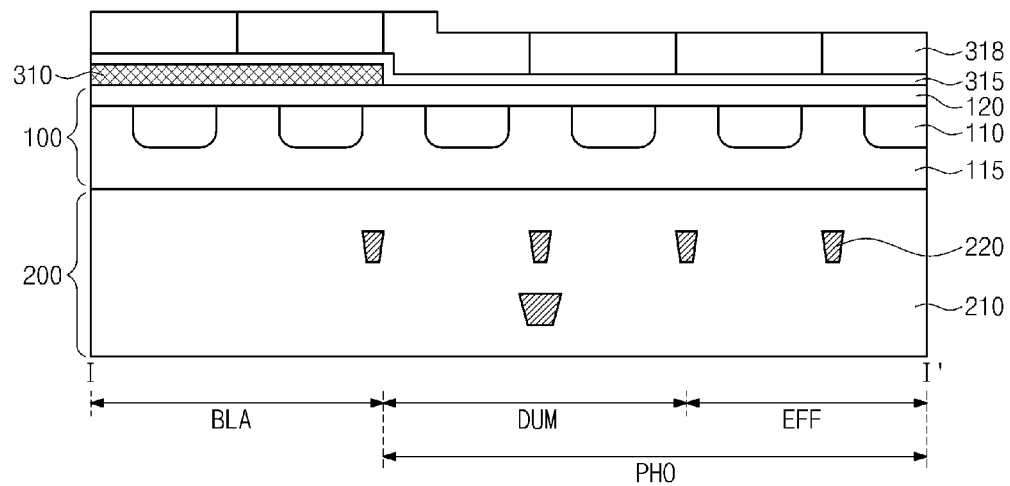

Referring to FIG. 8B, an exposing and developing process may be performed to the photoresist layer 316 to form first photoresist patterns 318, each of which faces a corresponding one of the unit pixels. According to FIG. 8B, unlike that of FIG. 7B, the exposing and developing process may not be performed to a portion of the photoresist layer 316 located on the staircase region SCR.

Figure 8C:
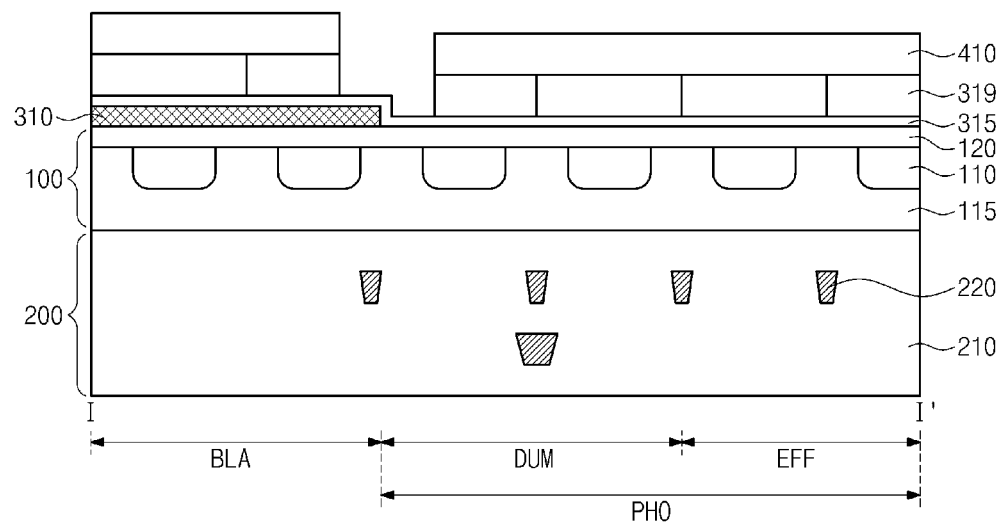

Referring to FIG. 8C, a mask pattern 410 may be formed on the first photoresist patterns 318, and the first photoresist patterns 318 may be partially removed using the mask pattern 410 to form second photoresist patterns 319.

For example, the mask pattern 410 may be formed to expose partially the first photoresist patterns 318 positioned on the staircase region SCR or near the staircase region SCR between the light-receiving region PHO and the light-blocking region BLA. The exposed portion of the first photoresist patterns 318 may be wholly or partially etched. After the etching process, the mask pattern 410 may be removed. The use of the mask pattern 410 makes it easy to remove partially the exposed portion of the first photoresist pattern 318 and thereby to remain the first photoresist pattern 318 on the staircase region SCR.

Figure 8D:
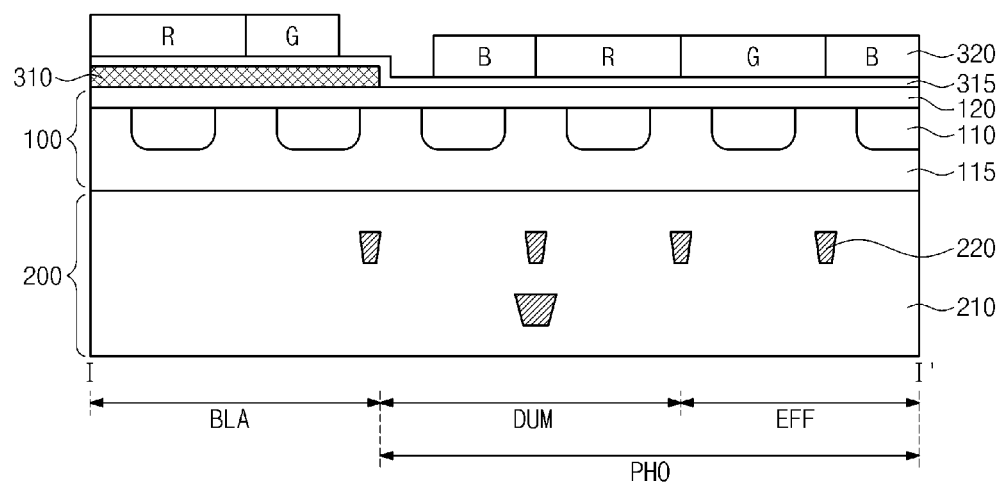

Referring to FIG. 8D, each of the second photoresist patterns 319 may be dyed with a specific color to form the color filters 320.

In an example embodiment, the dyeing process may be performed after the formation of the first photoresist patterns 318 and before the formation of the mask pattern 410.

Figure 9:
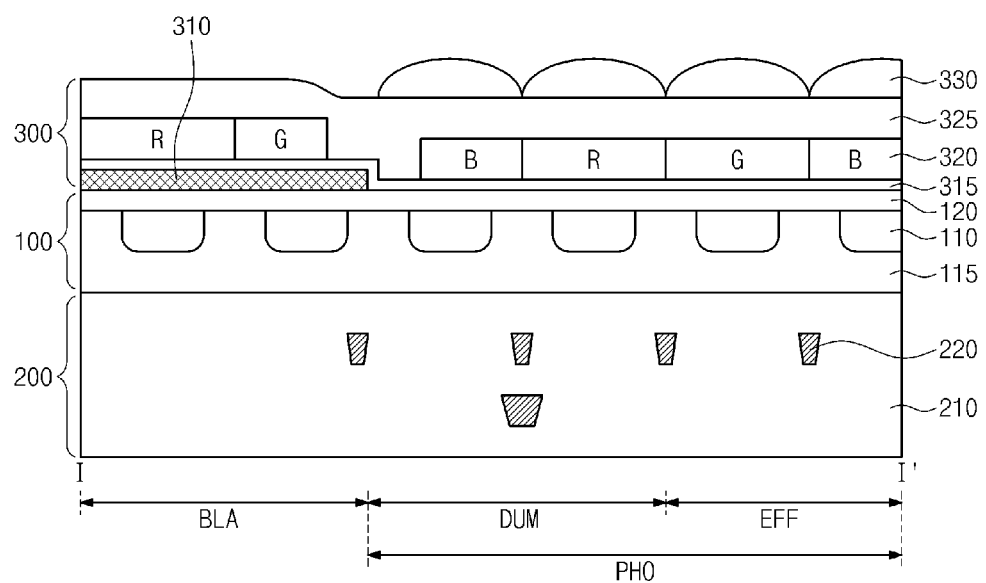
FIG. 9 is a sectional view of a method of fabricating an image sensor, according to example embodiments of inventive concepts.

Referring to FIG. 9, the micro lenses 330 may be formed on the color filters 320, after the etching process of the first photoresist patterns 318.

Each of the micro lenses 330 may be formed on a corresponding one of the color filters 320. The micro lens 330 may be formed using an optically-transparent photoresist (not shown). For example, the formation of the micro lens 330 may include forming photoresist patterns (not shown) on the photoelectric conversion devices 110, respectively, and then, performing a reflow or etching process to the photoresist patterns. Accordingly, the micro lenses 330 may be formed to have an upward-convex shape with a specific curvature radius.

If the color filters 320 on the staircase region SCR are not etched, the micro lenses 330 on the staircase region SCR may have bent or curved bottom surfaces, and this makes it difficult to focus properly and effectively the incident light on the photoelectric conversion device 110. By contrast, according to example embodiments of inventive concepts, some of the color filters 320 may be partially or wholly removed from the staircase region SCR, and thus, the micro lenses 330 may be formed to have flat bottom surfaces. Accordingly, it is possible to focus properly and effectively the incident light on the photoelectric conversion device 110. As a result, the image sensor can be configured to have high image quality.

Subsequently, a cleaning process may be performed to remove residues from surfaces of the micro lenses 330. Further, a bake process may be performed to improve structural stability of the micro lens 330.

In an example embodiment, the upper planarization layer 325 may be formed on the color filters 320. The upper planarization layer 325 may be formed of an optically-transparent material (e.g., polyimide or polyacrylic materials).

The process of fabricating the image sensor of FIGS. 3A and 3B has been described exemplarily. The image sensor of FIG. 3C may be realized by adjusting an etching condition of the etching process described with reference to FIGS. 7A and 7B to remove some of the color filters. The image sensor of FIG. 3D may be realized by changing positions of the semiconductor layer and the interconnection layer. Nevertheless, example embodiments of inventive concepts may not be limited to the afore-described examples of the fabricating process.

Figure 10:
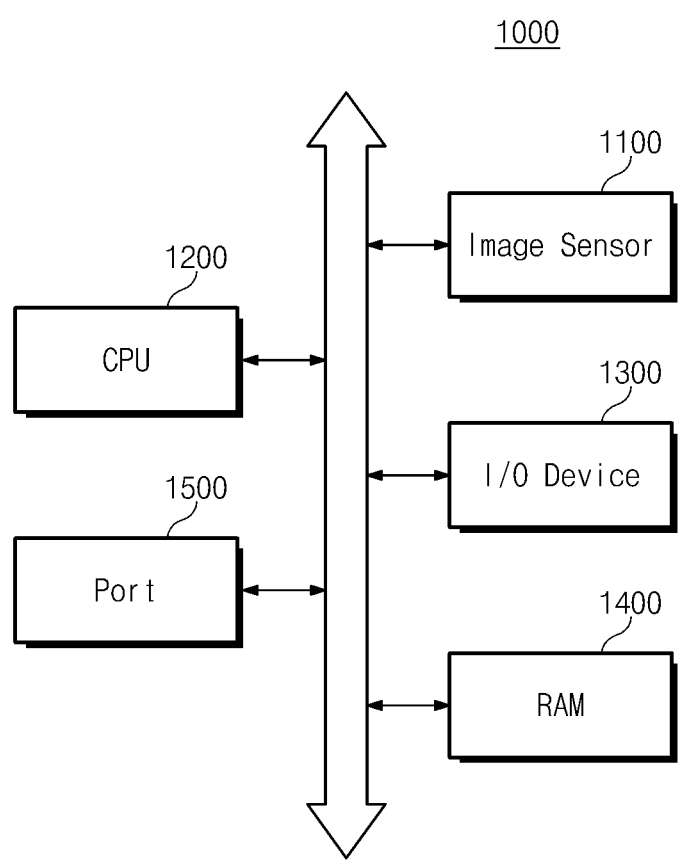
FIG. 10 is a schematic block diagram illustrating a process-based system including an image sensor, according to an example embodiment of inventive concepts.

FIG. 10 is a schematic block diagram illustrating a processor-based system including the image sensor according to example embodiments of inventive concepts.

Referring to FIG. 10, the processor-based system 1000 is a system that processes output images of an image sensor 1100.

The system 1000 may include one of a computer system, a camera system, a scanner, a mechanical clock system, a navigation system, a video phone, a monitoring system, an automatic focus system, a tracking system, an operation monitoring system, and an image stabilizing system. However, example embodiments are not limited thereto.

The processor-based system 1000 such as a computer system may include a central processing unit (CPU) 1200 such as a microprocessor capable of communicating with an I/O device 1300 via a bus 1001. The image sensor 1100 may communicate with the CPU 1200 and/or the I/O device 1300 via the bus 1001 or another communication link. The processor-based system 1000 may further include a RAM 1400 and/or a port 1500 capable of communicating with the CPU 1200 through the bus 1001.

The port 1500 may be coupled with a video card, a sound card, a memory card, a USB device, or the like. Further, the port 1500 may be connected to an additional system to carry out data communication with the additional system. The image sensor 1100 may be integrated with a CPU, a digital signal processing device (DSP), or a microprocessor. Moreover, the image sensor 1100 may be integrated with a memory. Alternatively, the image sensor 1100 may be integrated in a chip different from that of a processor.

Figure 11:
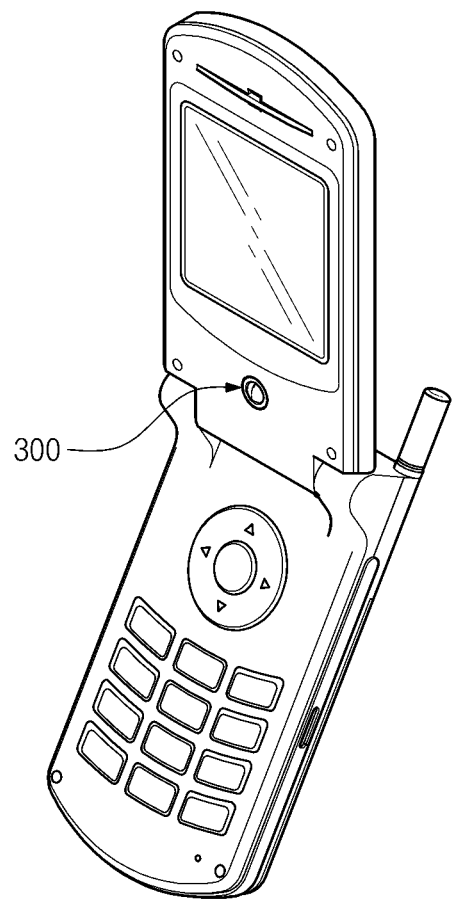
FIG. 11 is a perspective view illustrating an electronic device including an image sensor, according to an example embodiment of inventive concepts.

FIG. 11 is a perspective view illustrating an electronic product including an image sensor according to an example embodiment of inventive concepts.

Referring to FIG. 11, the image sensor according to example embodiments of inventive concepts may be applicable to a mobile phone 2000. Further, the image sensor according to the embodiment may also be applicable to cameras, camcorders, personal digital assistants (PDAs), wireless phones, laptop computers, optical mouse, facsimile machines or copying machines. In addition, the image sensor according to the embodiment may also be installed in telescopes, mobile phone handsets, scanners, endoscopes, fingerprint recognition systems, toys, game machines, household robots or automobiles.

According to example embodiments of inventive concepts, some of the color filters may be removed from the staircase region between the light-receiving and light-blocking regions, and thus, the micro lenses can have flat bottom surfaces. Accordingly, it is possible to prevent the incident light from deflecting by the micro lens, and thus, the image sensor can exhibit a reduced color distortion property.

While example embodiments of inventive concepts have been particularly shown and described, it will be understood by one of ordinary skill in the art that variations in form and detail may be made therein without departing from the spirit and scope of the attached claims.

What is claimed is:
1. An image sensor, comprising:
a semiconductor layer having a light-receiving region and a light-blocking region, the semiconductor layer including photoelectric conversion devices;
a light-blocking layer on a surface of the semiconductor layer and on the light-blocking region;
color filters on the semiconductor layer and the light-blocking layer; and
micro lenses on the color filters, the color filters being absent from an interface region, the interface region being between the light-receiving region and the light-blocking region.

2. The image sensor of claim 1, wherein
the light-blocking region surrounds the light-receiving region,
the light-receiving region includes an image region and a dummy region, and
the dummy region is between the image region and the light-blocking region.

3. The image sensor of claim 2, wherein the color filters are absent from a portion of the light-blocking region and a portion of the dummy region, and the portion of the light-blocking region and the portion of the dummy region are adjacent to each other.

4. The image sensor of claim 1, wherein a corresponding one of the color filters and a corresponding one of the micro lenses overlap each of the photoelectric conversion devices.

5. The image sensor of claim 4, further comprising:
an upper planarization layer between the color filters and the micro lenses, the upper planarization layer being on the interface region, the light-receiving region and the light-blocking region, the upper planarization layer being thicker on the interface region than on portions of the light-receiving and light-blocking regions.

6. The image sensor of claim 1, further comprising:
a lower planarization layer between the light-blocking layer and the color filters, the lower planarization layer being exposed on the interface region.

7. The image sensor of claim 1, further comprising:
an interconnection layer on an opposite surface of the semiconductor layer, the interconnection layer and the light-blocking layer being spaced apart from each other by the semiconductor layer.

8. The image sensor of claim 1, further comprising:
an interconnection layer between the light-blocking layer and the semiconductor layer.

\* \* \* \* \*